United States Patent [19]
Kallin et al.

[11] Patent Number: 5,006,960
[45] Date of Patent: Apr. 9, 1991

[54] MEANS FOR ROUTING CONNECTION CABLES OUT OF A TABLE TOP TERMINAL

[75] Inventors: Fredrik L. N. Kallin, Kitchener; Alistair R. Hamilton, Waterloo; Graham Luckhurst, Kitchener, all of Canada

[73] Assignee: NCR Corporation, Dayton, Ohio

[21] Appl. No.: 463,646

[22] Filed: Jan. 11, 1990

[51] Int. Cl.$^5$ .............................................. H05K 5/00
[52] U.S. Cl. ................................. 361/390; 174/65 R; 174/135; 361/331; 361/428; 439/449; 439/459
[58] Field of Search ............. 174/65 R, 135; 312/223; 361/331, 380, 391–395, 399, 426, 428; 439/449, 456, 459, 719

[56] References Cited

U.S. PATENT DOCUMENTS

| | | | |
|---|---|---|---|
| 2,544,343 | 3/1951 | Miller | 173/322 |
| 3,879,571 | 4/1975 | Reed | 174/65 R |
| 4,342,946 | 8/1982 | Valenzona et al. | 361/392 |
| 4,367,909 | 1/1983 | Shatto, Jr. et al. | 339/176 MF |
| 4,679,869 | 7/1987 | Watson | 439/78 |
| 4,680,425 | 7/1987 | Speraw | 174/50 |
| 4,816,619 | 3/1989 | Heys, Jr. et al. | 174/135 |

OTHER PUBLICATIONS

U.S. patent application Ser. No. 413,657, filed Sep. 28, 1989, assignee NCR Corporation.

Primary Examiner—Gregory D. Thompson
Attorney, Agent, or Firm—Wilbert Hawk, Jr.; Albert L. Sessler, Jr.; Elmer Wargo

[57] ABSTRACT

A cable clip apparatus for routing connection cables out of a table top terminal, like a bank data entry machine, for example. The apparatus includes a coupling member which is located inside a cabinet of the terminal. Mating coupling members are coupled to the coupled member by inserting the mating coupling members in a vertical direction into the coupling member. Cables associated with the mating coupling members pass through slots in a perimeter portion of the cabinet, and thereafter, a cover which is part of the cabinet is closed to retain the cables in the side portion of the terminal. The coupling member is mounted above a circuit board within the terminal.

10 Claims, 2 Drawing Sheets

MEANS FOR ROUTING CONNECTION CABLES OUT OF A TABLE TOP TERMINAL

BACKGROUND OF THE INVENTION (1) Field of the Invention

This invention relates to a means for routing connection cables out of a business machine or terminal.

(2) Background Information

In recent years there has been a trend to make business machines or terminals more attractive in appearance and to design the terminals to occupy a smaller space or to have a "smaller footprint" when compared to terminals of the past. This is especially true for terminals like encoders or printers, for example, which are placed on a table top or counter.

One of the problems with table top terminals is that they tend to get pushed around while in use on the table. Generally, the prior art terminals have connection cables which extend from connectors located at the backs of the terminals. When such a terminal is pushed around, the connectors, which are exposed, tend to get damaged. Additionally, when the cables are accidentally pulled, the connectors tend to be pulled out of the machine, disrupting the operation of the terminal and other terminals attached to it. In some situations, the connectors on a terminal may face a customer standing on one side of a counter while an operator operates the terminal while standing on the other side of the counter. The exposure of the customer to such connectors may present a hazard to the customer.

SUMMARY OF THE INVENTION

An object of this invention is to provide an inexpensive and neat apparatus for routing connection cables out of a terminal.

An advantage of this invention is that the connectors for connecting the terminal to other equipment are not visible from any direction when looking at the outside of the terminal.

Another advantage is that when the apparatus of this invention is used in a table top terminal which tends to get pushed around in use, the cable connectors, which are located inside the cabinet of the terminal, are protected.

In a preferred embodiment of this invention, there is provided a cable clip apparatus comprising:

a cabinet having a base portion including a perimeter portion;

said perimeter portion having at least one slot therein to receive a cable therein;

said base portion having a coupling member therein located adjacent to said slot;

said cable having a cooperative coupling member on an end thereof, with said cooperative coupling member being coupled to said coupling member;

said cabinet also having a cover hinged to said base portion to enable said cover to be moved between opened and closed positions relative to said base portion; and said one slot being located in said perimeter portion to enable said cover to be moved to said closed position only when said cable is properly positioned in said one slot.

In another aspect of this invention, there is provided a table top terminal comprising;

a cabinet having a base portion including a perimeter portion;

a circuit board mounted in said cabinet substantially parallel to said base portion;

a coupling member mounted on said circuit board and coupled thereto; and cables having cooperative ends coupled to said coupling member;

said cabinet also having a cover hinged to said perimeter portion to enable said cover to be moved between opened and closed positions relative to said base portion;

said perimeter portion having slots therein to receive said cables;

said slots being located in said perimeter portion to enable said cover to be moved to said closed position only when said cables are properly positioned in said slots; and said coupling member and said cooperative ends being located in said cabinet to be protected by said cover when said cover is moved to said closed position.

The above advantages, and others, will be more readily understood in connection with the following description, claims, and drawing.

DESCRIPTION OF A PREFERRED EMBODIMENT

Figure 1:
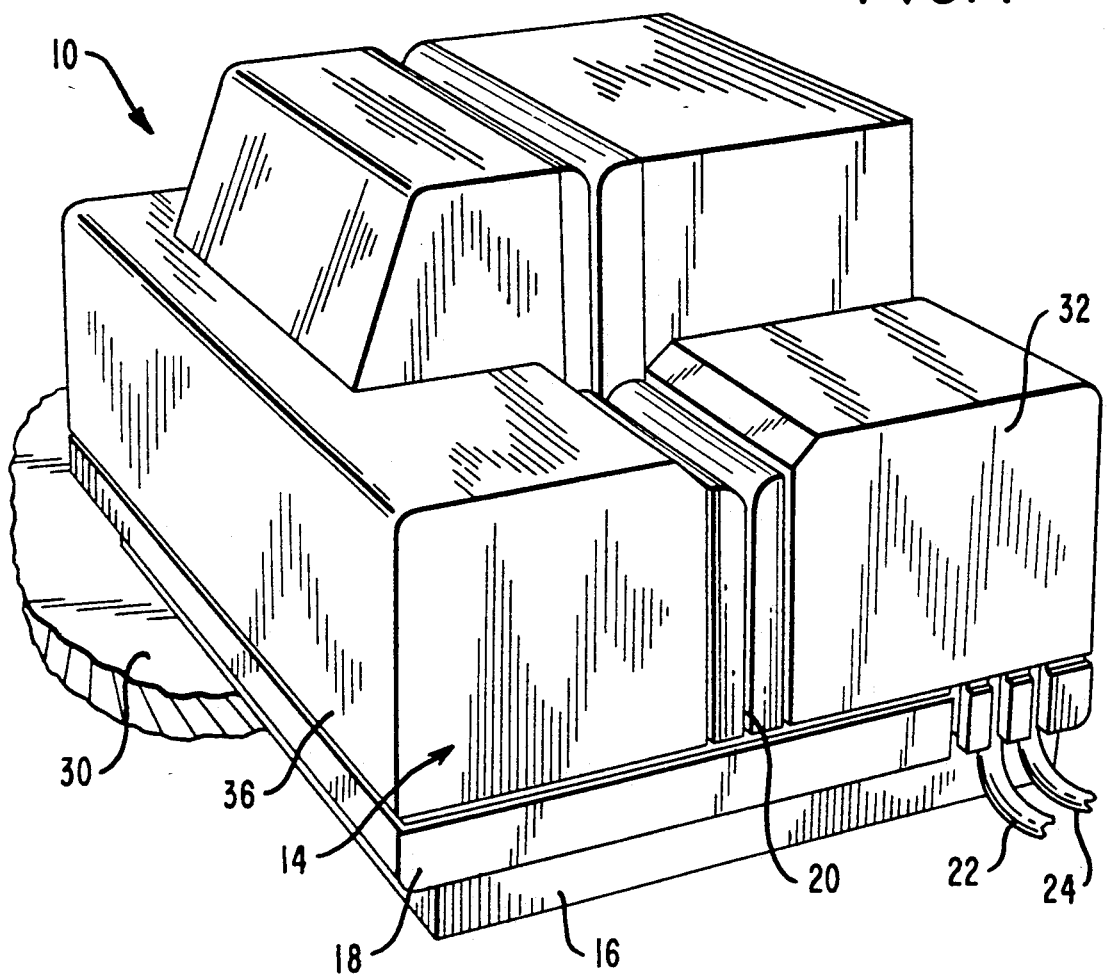
FIG. 1 is a general perspective view of a terminal in which a preferred embodiment of the apparatus of this invention may be used.

FIG. 1 shows a business machine or terminal 10 in which a preferred embodiment or apparatus 12 (FIG. 2) of this invention may be used. The terminal 10 may be a table top terminal, like a teller operated entry terminal at a bank or an encoder, for example, although the apparatus 12 may be used in other terminals.

The terminal 10 includes a cabinet designated generally as 14, with the cabinet 14 (shown closed in FIG. 1) having a base portion 16 including a perimeter portion 18. The cabinet 14 may be made of a conventional plastic material. The terminal 10 shown also has a document track 20 for moving documents (not shown) therethrough as the documents (like bank checks and deposit slips) are processed by the terminal 10. Because this aspect is not important to an understanding of this invention, it need not be discussed in any further detail.

Apparatus 12 (FIG. 2) provides the means for routing connection cables, like 22 and 24, out of the terminal 10 to enable the terminal 10 to be coupled to other units or terminals, like a host computer, for example, with these other units not being shown. The apparatus 12 is also referred to as a cable clip.

The apparatus 12 (FIG. 2) includes a coupling member 26 which is mounted on a circuit board 28 which, in turn, is mounted substantially parallel to the base portion 16 of the terminal 10. The base portion 16 of the terminal 10 rests on a counter or table top 30 (shown only partially in FIGS. 1 and 2). The top 26-1 of the coupling member 26, as viewed in FIG. 2, lies in an imaginary plane which is substantially parallel to the circuit board 28. The apparatus 12 also includes a cover 32 which is pivotally joined to the perimeter portion 18 of the base portion 16 by a conventional hinge 34, which is shown only as a line in FIG. 2, to enable the cover 32 to be pivotally moved between the closed position shown in FIG. 1 and the opened position shown in FIG. 2. Panel 36 represents the front of the cabinet 14, with the cables coming out one of the sides (like side 14-1) of the terminal 10 as shown.

Figure 3:
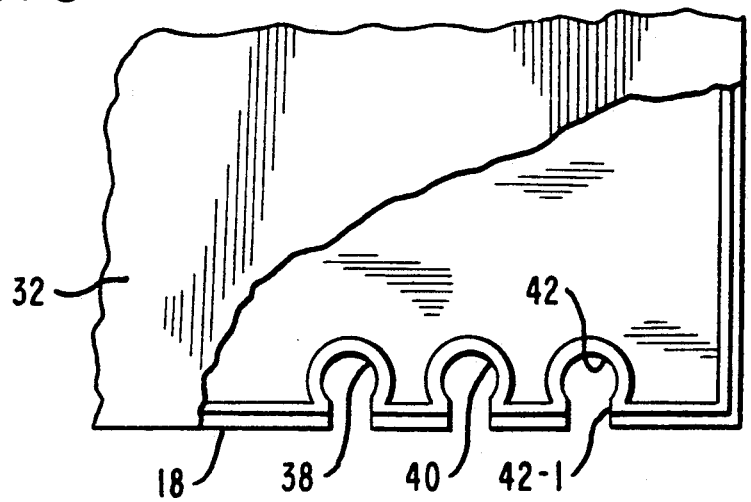
FIG. 3 (shown on the sheet containing FIG. 1) is a plan view of a portion of the terminal shown in FIG. 1, with a portion of the cover being removed to show the shapes of the slots in which the cables are mounted.
Figure 2:
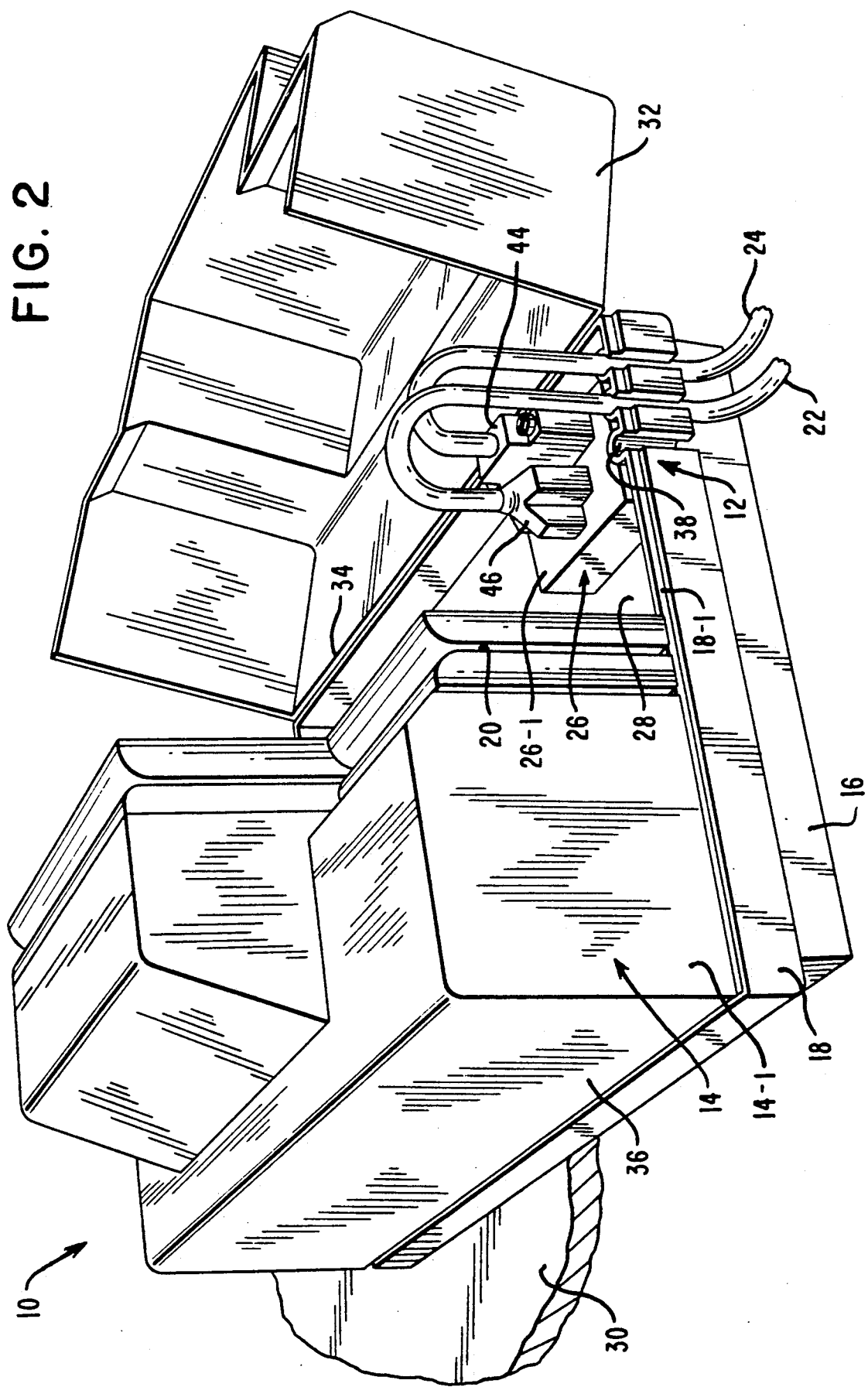
FIG. 2 is a general perspective view of the terminal shown in FIG. 1 in which a cover of the terminal is shown in an opened position to expose the apparatus of this invention, with cables being mounted in slots located in a perimeter portion of the terminal.

The perimeter portion 18 has a plurality of slots 38, 40, and 42 therein, as shown best in FIG. 3, in which the cables, like 22 and 24 are mounted. Each of the slots 38, 40, and 42 has a longitudinal axis (not shown) which is substantially perpendicular to the base portion 16 and the table top 30. Each of these slots, like 42 for example, is dimensioned to provide an entry throat 42-1 which has a width which is less than the diameter of the slot 42 itself. As a cable, like 24, is inserted in the apparatus 12, the diameter of the cable 24 is compressed slightly by the entry throat 42-1 as the cable is pushed into the slot 42. This construction helps to retain the cable 24 in the associated slot 42 prior to moving the cover 32 to the closed position shown in FIG. 1. The cable 24 has a cooperative coupling member 44 on the end thereof to couple the cable 24 with the coupling member 26. Similarly, the cable 22 has a cooperative coupling member 46 on the end thereof to couple the cable 22 with the coupling member 26. The coupling member 26 and the cooperative coupling members 46 and 48 may be conventional male-female coupling members, for example. After the cooperative coupling members 46 and 48 are inserted in the coupling member 26 and the cables 22 and 24 are pushed into the associated slots 40 and 42, as shown in FIG. 2, the cover 32 may be moved to the closed position shown in FIG. 1. The perimeter portion 18 has a recessed lip 18-1 which receives the cover 32 and provides some rigidity for the cover 32.

Having described the apparatus 12, it appears appropriate to discuss the advantages of this apparatus. One of the features of this invention relates to the cover 32 as described in the previous paragraph. Notice that the cover 32 cannot be moved to the closed position until the cables 22 and 24 are inserted properly in their associated slots 40 and 42. Because these slots 38, 40, and 42 are molded in the side portion 18, no additional parts are necessary to mount the cables, like 22 and 24, in their associated slots 40 and 42.

Another advantage relates to having the coupling member 26 located inside the cabinet 14 as shown in FIG. 2. Notice that the cooperative coupling members, like 44 and 46, are pushed in a vertical direction (as viewed in FIG. 2) into the coupling member 26. This means that less board space is taken up on the circuit board 28 compared to prior art couplers which are end mounted as discussed in the Background of the Invention. Having the coupling members 44 and 46 mounted for vertical insertion makes it easier to do "trace routing" on the circuit board 28 when more than one communications coupler, like cooperative coupling member 44, is needed. The trace routes are considerably shortened compared to those necessary in rear mounted couplers.

With the couplers, like 26, mounted inside the cabinet 14, the terminal 10 presents a neat appearance as shown in FIG. 1. This is especially important for table top terminals where appearance and a small footprint are important. If the cables 22 and 24 are accidentally pulled while the cover 32 is closed, these cables would tend to raise the cover 32, thereby absorbing some of the energy of the pull to perhaps prevent the cooperative coupling members 44 and 46 from being disconnected. Also, with these coupling members 44 and 46 and 26 located on the inside of the cabinet 14, there is less of a chance for an electrostatic discharge to damage the circuit board 28.

We claim:

1. An apparatus comprising:
   a cabinet having a base portion including a perimeter portion;
   said perimeter portion having at least one slot therein to receive a cable therein;
   said base portion having a coupling member therein located adjacent to said at least one slot;
   said cable having a cooperative coupling member on an end thereof, with said cooperative coupling member being coupled to said coupling member;
   said cabinet also having a cover coupled to said base portion to enable said cover to be moved between opened and closed positions relative to said base portion; and
   said at least one slot being located in said perimeter portion to enable said cover to be moved to said closed position only when said cable is properly positioned in said at least one slot.

2. The apparatus as claimed in claim 1 in which said coupling member has a mounting plane which is substantially parallel to said base portion and in which said at least one slot has a longitudinal axis which is substantially perpendicular to said mounting plane.

3. An apparatus comprising:
   a cabinet having a base portion including a perimeter portion;
   said perimeter portion having at least one slot therein to receive a cable therein;
   said base portion having a coupling member therein located adjacent to said at least one slot;
   said cable having a cooperative coupling member on an end thereof, with said cooperative coupling member being coupled to said coupling member;
   said cabinet also having a cover coupled to said base portion to enable said cover to be moved between opened and closed positions relative to said base portion;
   said at least one slot being located in said perimeter portion to enable said cover to be moved to said closed position only when said cable is properly positioned in said at least one slot;
   said coupling member having a mounting plane which is substantially parallel to said base portion and in which said at least one slot has a longitudinal axis which is substantially perpendicular to said mounting plane; and
   said perimeter portion of said cabinet being made of plastic material.

4. The apparatus as claimed in claim 3 in which said cabinet also has an electronic control board located therein, with said electronic control board being positioned substantially parallel to said base portion, with said mounting plane of said coupling member being substantially parallel to said electronic control board, with said coupling member being coupled to said electronic control board, and with said coupling member being covered by said cover when said cover is moved to said closed position.

5. An apparatus comprising:
   a cabinet having a base portion including a perimeter portion;
   said perimeter portion having at least one slot therein to receive a cable therein;
   said base portion having a coupling member therein located adjacent to said at least one slot;
   said cable having a cooperative coupling member on an end thereof, with said cooperative coupling member being coupled to said coupling member;
   said cabinet also having a cover hinged to said base portion to enable said cover to be moved between opened and closed positions relative to said base portion;
   said at least one slot being located in said perimeter portion to enable said cover to be moved to said closed position only when said cable is properly positioned in said at least one slot;
   said coupling member having a mounting plane which is substantially parallel to said base portion and in which said at least one slot has a longitudinal axis which is substantially perpendicular to said mounting plane;
   said perimeter portion of said cabinet being made of plastic material;
   said cabinet also having an electronic control board located therein, with said electronic control board being positioned substantially parallel to said base portion, with said mounting plane of said coupling member being substantially parallel to said electronic control board, with said coupling member being coupled to said electronic control board, and with said coupling member being covered by said cover when said cover is moved to said closed position; and
   said at least one slot being dimensioned to provide an entry throat which compresses the cable slightly as the cable is inserted in said at least one slot, thus helping to retain the cable in said at least one slot after the cable is inserted therein.

6. The apparatus as claimed in claim 5 in which said cabinet has a front and a side, with said perimeter portion with said at least one slot therein being located on said side.

7. A table top terminal comprising:
   a cabinet having a base portion including a perimeter portion;
   a circuit board mounted in said cabinet substantially parallel to said base portion;
   a coupling member mounted on said circuit board and coupled thereto; and
   cables having cooperative ends coupled to said coupling member;
   said cabinet also having a cover hinged to said perimeter portion to enable said cover to be moved between opened and closed positions relative to said base portion;
   said perimeter portion having slots therein to receive said cables;
   said slots being located in said perimeter portion to enable said cover to be moved to said closed position only when said cables are properly positioned in said slots; and
   said coupling member and said cooperative ends being located in said cabinet to be protected by said cover when said cover is moved to said closed position.

8. The table top terminal as claimed in claim 7 in which said coupling member has a mounting plane which is substantially parallel to said circuit board, and in which each of said slots has a longitudinal axis which is substantially perpendicular to said mounting plane.

9. The table top terminal as claimed in claim 8 in which each of said slots is dimensioned to provide an entry throat which compresses the associated cable slightly as the associated cable is inserted in the associated slot, thus helping to retain the associated cable in the associated slot.

10. The table top terminal as claimed in claim 9 in which said cabinet has a front and a side, with said perimeter portion with the slots therein being located on said side.

* * * * *